United States Patent
Danioni (10) Patent No.: US 11,824,503 B2
(45) Date of Patent: *Nov. 21, 2023

(54) CHARGE AMPLIFIER CIRCUIT WITH A HIGH OUTPUT DYNAMIC RANGE FOR A MICROELECTROMECHANICAL SENSOR

(71) Applicant: STMicroelectronics S.r.l., Agrate Brianza (IT)

(72) Inventor: Alberto Danioni, Vittuone (IT)

(73) Assignee: STMicroelectronics S.r.l., Agrate Brianza (IT)

(*) Notice: Subject to any disclaimer, the term of this patent is extended or adjusted under 35 U.S.C. 154(b) by 42 days.

This patent is subject to a terminal disclaimer.

(21) Appl. No.: 17/501,699

(22) Filed: Oct. 14, 2021

(65) Prior Publication Data

US 2022/0038065 A1  Feb. 3, 2022

Related U.S. Application Data

(63) Continuation of application No. 16/736,513, filed on Jan. 7, 2020, now Pat. No. 11,177,779.

(30) Foreign Application Priority Data

Feb. 1, 2019 (IT) .......................... 102019000001505

(51) Int. Cl.
*H03F 3/16* (2006.01)
*H04R 3/00* (2006.01)
(Continued)

(52) U.S. Cl.
CPC ....... *H03F 3/16* (2013.01); *H03K 19/018557* (2013.01); *H04R 3/00* (2013.01); *H04R 19/04* (2013.01); *H04R 2201/003* (2013.01)

(58) Field of Classification Search
CPC ..... H03F 1/26; H03F 1/32; H03F 1/34; H03F 1/343; H03F 1/345; H03F 1/38;
(Continued)

(56) References Cited

U.S. PATENT DOCUMENTS 5,025,226 A * 6/1991 Taylor ................... H03F 3/3455
330/296
5,777,517 A * 7/1998 Seshita ................. H03F 3/3455
330/277
(Continued)

FOREIGN PATENT DOCUMENTS

GB  2466776 A  7/2010
GB  2560588 A  9/2018
JP  2004254071 A * 9/2004 ............... H03F 3/04

OTHER PUBLICATIONS

Chang, "Low-Noise Wide-Band Amplifiers in Bipolar and CMOS Technologies," *Kluwer Academic Publishers*, 1991, 232 pages.
(Continued)

*Primary Examiner* — Thang V Tran
(74) *Attorney, Agent, or Firm* — SEED IP LAW GROUP LLP (57) ABSTRACT

A charge amplifier circuit is provided. The charge amplifier circuit is couplable to a transducer that generates an electrical charge that varies with an external stimulus. The charge amplifier circuit includes an amplification stage having an input node, couplable to the transducer, and an output node. The amplification stage biases the input node at a first direct current (DC) voltage. The charge amplifier circuit includes a feedback circuit, which includes a feedback capacitor, electrically coupled between the input and
(Continued)

output nodes of the amplification stage. The feedback circuit includes a resistor electrically coupled to the input node, and a level-shifter circuit, electrically coupled between the resistor and the output node. The level-shifter circuit biases the output node at a second DC voltage and as a function of a difference between the second DC voltage and a reference voltage.

18 Claims, 6 Drawing Sheets

(51) Int. Cl.
*H03K 19/0185* (2006.01)
*H04R 19/04* (2006.01)

(58) Field of Classification Search
CPC ... H03F 3/04; H03F 3/16; H03F 3/181; H03F 3/183; H03F 3/185; H03F 3/187; H03F 3/3018; H03F 3/45183; H03F 2200/03; H03F 2200/375; H03F 2203/30061; H03F 2203/30063; H03F 2203/30069; H04R 3/00; H04R 1/04; H04R 19/04; H04R 2201/003; H03K 19/0185; H03K 19/018557
See application file for complete search history.

(56) References Cited

U.S. PATENT DOCUMENTS

| | | | |
|---|---|---|---|
| 11,177,779 B2* | 11/2021 | Danioni | H04R 1/04 |
| 2005/0151589 A1 | 7/2005 | Fallesen | |
| 2008/0310655 A1 | 12/2008 | Holzmann | |
| 2009/0046870 A1 | 2/2009 | Turnbull | |
| 2009/0110213 A1 | 4/2009 | Holzmann | |
| 2011/0102082 A1* | 5/2011 | Rafeeque | H03F 3/187 |
| | | | 330/253 |
| 2011/0260788 A1 | 10/2011 | Inukai et al. | |
| 2012/0014541 A1 | 1/2012 | Nakayama et al. | |
| 2013/0129119 A1* | 5/2013 | Miyatake | H04R 19/04 |
| | | | 381/176 |
| 2013/0266156 A1 | 10/2013 | Fröhlich et al. | |
| 2014/0037112 A1 | 2/2014 | Lee et al. | |
| 2015/0016635 A1 | 1/2015 | Haas-Christensen et al. | |
| 2015/0084694 A1 | 3/2015 | Lee | |
| 2016/0076933 A1 | 3/2016 | Leone et al. | |
| 2016/0077198 A1 | 3/2016 | Leone et al. | |
| 2017/0077911 A1 | 3/2017 | Badillo et al. | |
| 2019/0033348 A1 | 1/2019 | Zeleznik et al. | |
| 2020/0396403 A1* | 12/2020 | Ebihara | H04N 25/772 |

OTHER PUBLICATIONS

Sautto et al., "A CMUT Transceiver Front-End with 100-V TX Driver and 1-mW Low-Noise Capacitive Feedback RX Amplifier in BCD-SOI Technology," *ESSCIRC* 2014, 4 pages.

* cited by examiner

FIG. 1

(PRIOR ART)

FIG. 2

(PRIOR ART)

FIG. 8 ed at an input biasing voltage $V_{CMI}$ and at an output biasing
CHARGE AMPLIFIER CIRCUIT WITH A HIGH OUTPUT DYNAMIC RANGE FOR A MICROELECTROMECHANICAL SENSOR

BACKGROUND

Technical Field

The present disclosure relates to a charge amplifier circuit with a high output dynamic range, which can be coupled to a MEMS (MicroElectroMechanical System) sensor.

Description of the Related Art

Today microelectromechanical devices, known simply as MEMS devices, are very widespread.

Figure 1:
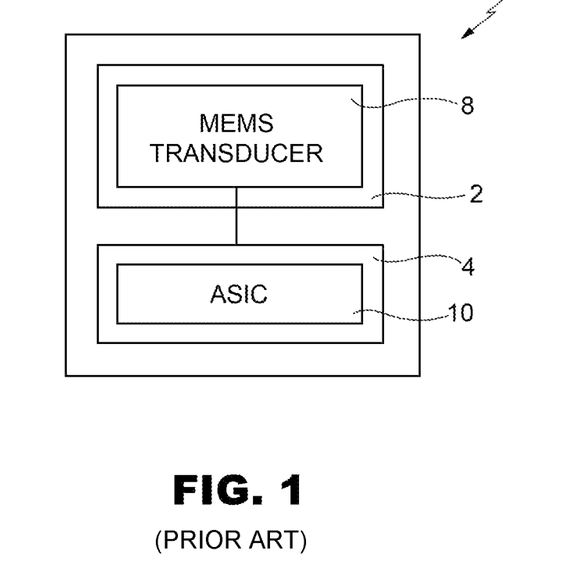
FIG. 1 shows a block diagram of a microelectromechanical system (MEMS) device.

MEMS devices can perform the most disparate functions. For example, MEMS microphones are known, each of which is formed, as illustrated in FIG. 1, by a first and a second pad 2, 4 of semiconductor material. Furthermore, the MEMS microphone, designated by 1, comprises a MEMS transducer 8, formed in the first pad 2, and an integrated circuit 10, formed in the second pad 4. The integrated circuit 10 is usually of an ASIC (Application-Specific Integrated Circuit) type and is commonly known as "readout circuit 10".

Figure 2:
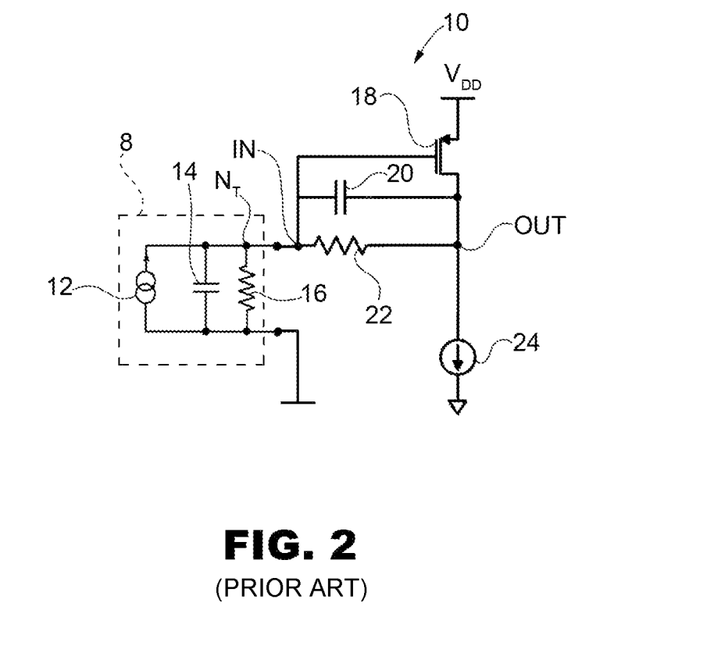
FIG. 2 shows an equivalent circuit diagram of the MEMS device illustrated in FIG. 1.

The MEMS transducer 8 includes a membrane (not illustrated) adapted to undergo deformation in the presence of an acoustic signal (stimulus) coming from the outside. Furthermore, the MEMS transducer 8 is, for example, of a piezoelectric type; i.e., it includes at least one piezoelectric region (not illustrated), which is operatively coupled to the membrane and is adapted to generate an electrical charge as a function of the deformation of the membrane. From an electrical point of view, the MEMS transducer 8 can hence be modelled as shown in FIG. 2, which illustrates a variable-current generator 12, which is configured to inject a current into a transduction capacitor 14 and into a transduction resistor 16, which are connected in parallel; this current is a function of the deformation of the membrane.

In particular, the term "transduction node $N_T$" indicates the node into which the variable-current generator 12 injects the current, the transduction capacitor 14, the transduction resistor 16, and the variable-current generator 12 are set between the transduction node $N_T$ and the ground of the MEMS transducer 8.

The readout circuit 10 is electrically coupled to the MEMS transducer 8 so as to convert the charge generated by the MEMS transducer 8 into an output voltage $V_{out}$.

The readout circuit 10 therefore acts as an amplifier, preferably of the low-noise type. Furthermore, the readout circuit 10 is characterized by a low current consumption and by a high AOP (Acoustic-Overload Point), understood as the amplitude of the input acoustic level such that the THD (Total Harmonic Distortion) reaches 10%.

An example of implementation of the readout circuit 10 is illustrated once again in FIG. 2.

In particular, the readout circuit 10 comprises a MOSFET 18 of the P-channel enhancement-mode type. The source terminal of the MOSFET 18 is connected to a supply node $N_{DD}$, which in use is set at a supply voltage $V_{DD}$. The gate terminal of the MOSFET 18 forms an input node IN of the readout circuit 10; the drain terminal of the MOSFET 18 forms an output node OUT of the readout circuit 10.

The readout circuit 10 also comprises a capacitor 20 and a resistor 22, which are referred to hereinafter as "feedback capacitor 20" and "feedback resistor 22", respectively.

The feedback capacitor 20 and the feedback resistor 22 are connected in parallel between the input node IN and the output node OUT of the readout circuit 10. In particular, a first terminal of the feedback resistor 22 is connected to the input node IN, whereas a second terminal of the feedback resistor 22 is connected to the output node OUT. Furthermore, the input node IN is connected to the transduction node $N_T$, and in particular electrically coincides with the latter.

The readout circuit 10 also comprises a respective current generator 24, which is connected between the output node OUT and the ground of the readout circuit 10 and generates a constant current, directed towards the ground of the readout circuit 10.

That said, since the transduction resistor 16 and the feedback resistor 22 have particularly high values, the input node IN and the output node OUT are biased, respectively, at an input biasing voltage $V_{CMI}$ and at an output biasing voltage $V_{CMO}$, which are equal to each other and are set, respectively, by the threshold voltage of the MOSFET 18 and by the current that flows in the MOSFET 18. In greater detail, if we designate the gate-to-source voltage of the MOSFET 18 with $V_{GS}$, we have $V_{CMI}=V_{CMO}=V_{DD}-|V_{GS}|$.

The output biasing voltage $V_{CMO}$ represents the so-called output quiescent level, i.e., the voltage value supplied by the readout circuit 10 in the absence of acoustic signals on the MEMS transducer 8.

Figure 3:
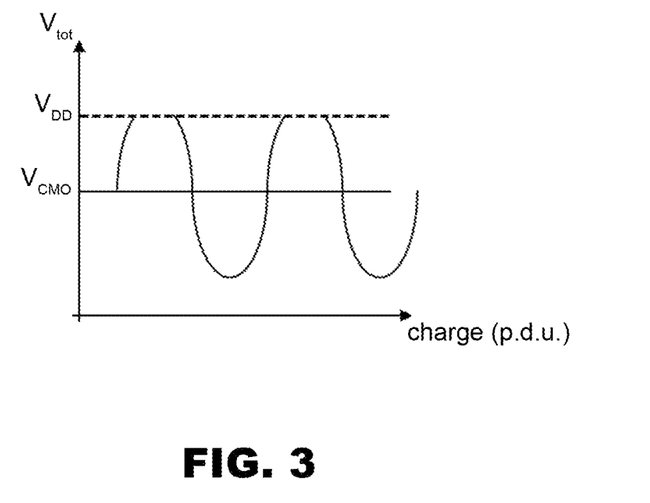
FIG. 3 shows an example of plot of an analog signal, as a function of an electrical charge.

In practice, the output node OUT is biased at a voltage value relatively close to the supply voltage $V_{DD}$. Consequently, if we designate the voltage present on the output node OUT in the presence of an acoustic signal that reaches the MEMS transducer 8 with $V_{tot}$, it may occur that, as the amplitude of the acoustic signal increases, the voltage $V_{tot}$ reaches the supply voltage $V_{DD}$ and hence undergoes clipping, as illustrated by way of example in FIG. 3. In other words, the voltage $V_{tot}$ is no longer directly proportional to the charge present in the transduction capacitor 14, but rather saturated to a value equal to the supply voltage $V_{DD}$. Therefore, the operation of amplification performed by the readout circuit 10 introduces a high distortion.

BRIEF SUMMARY

An aim of the present disclosure is therefore to provide an electronic circuit that will solve at least in part the drawbacks of the prior art.

According to the present disclosure, a charge amplifier circuit is provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 4:
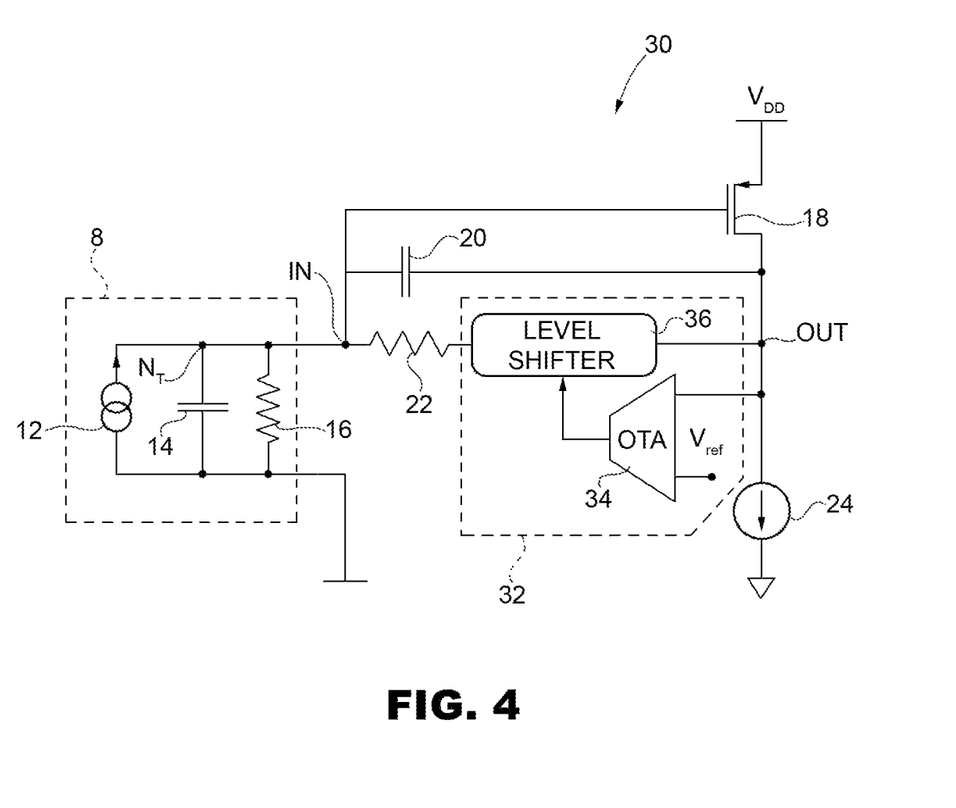
FIG. 4 shows a principle circuit diagram of the present electronic circuit, coupled to a sensor.

The present circuit is based on the idea of decoupling the biasing voltages of the input node IN and of the output node OUT of the readout circuit, as illustrated schematically in FIG. 4, where elements already present in FIG. 2 are designated by the same reference signs, unless specified otherwise. In addition, the readout circuit, designated by 30, is described limitedly to the differences with respect to what is illustrated in FIG. 1.

In detail, the readout circuit 30 comprises a feedback circuit 32, which in turn comprises a control circuit 34 and a level shifter 36.

The control circuit 34 comprises a first input, connected to the output node OUT, and a second input, which in use is set at a reference voltage $V_{ref}$. As described in greater detail hereinafter, the reference voltage $V_{ref}$ is directly proportional to the supply voltage $V_{DD}$, or is generated by using a corresponding bandgap circuit (not illustrated). In what follows it is assumed, purely by way of example, that the relation $V_{ref}=0.5*V_{DD}$ applies, and that the reference voltage $V_{ref}$ is generated starting from the supply voltage $V_{DD}$ by means of a resistive divider (not shown).

The level shifter 36 is connected between the second terminal of the feedback resistor 22 and the output node OUT. Furthermore, the level shifter 36 is operatively connected to the output of the control circuit 34, as described hereinafter. The resistance of the feedback resistor 22 ranges, for example, between 100 GΩ and 1 TΩ.

Figure 5:
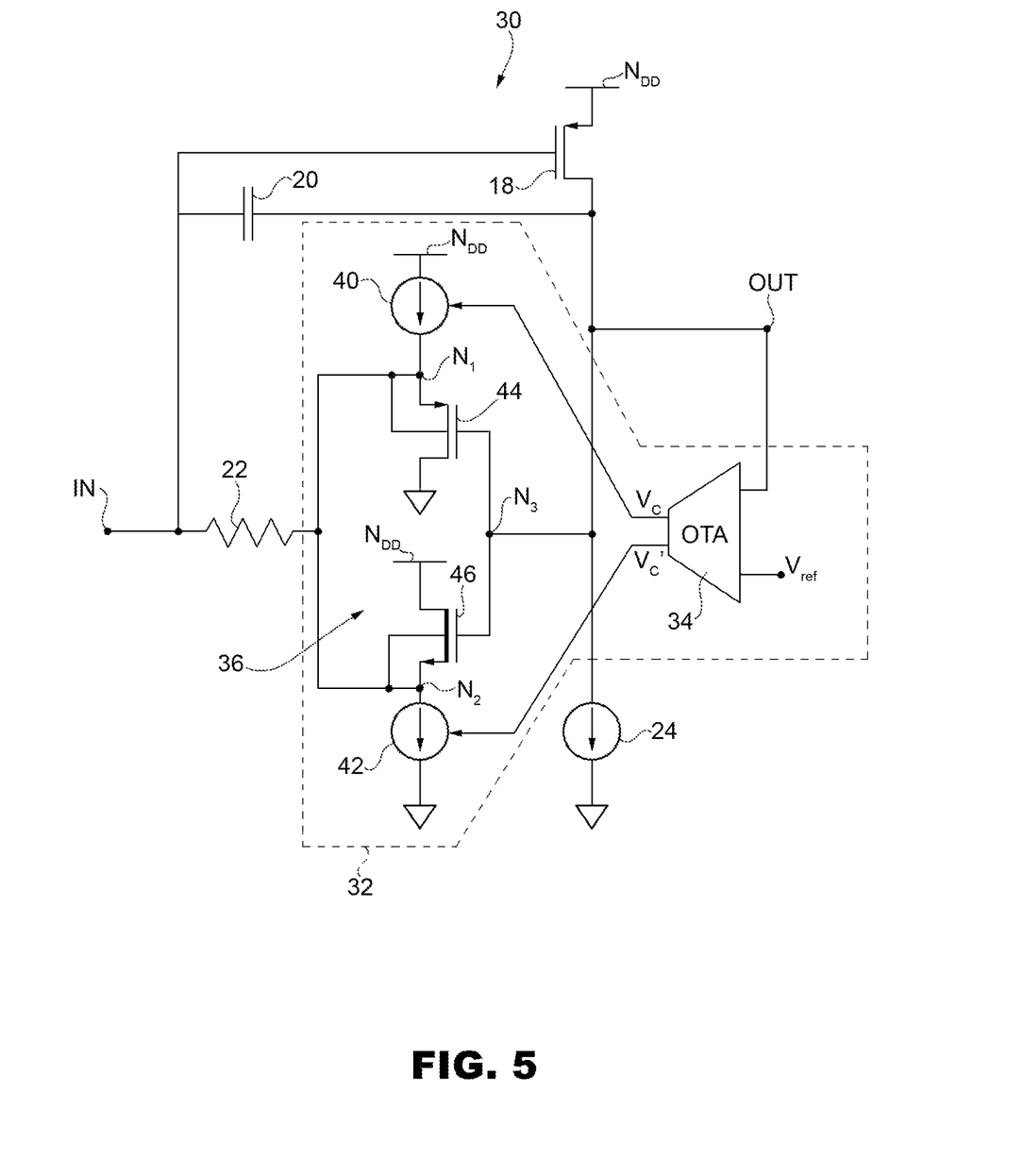
FIG. 5 shows a circuit diagram of the present electronic circuit, with parts represented schematically in terms of working principle.

As shown in FIG. 5, the level shifter 36 comprises a respective pair of variable-current generators 40, 42, referred to hereinafter as the "first level-shift generator 40" and the "second level-shift generator 42", as well as a pair of respective MOSFETs 44, 46, referred to hereinafter as the "first level-shift transistor 44" and the "second level-shift transistor 46".

The first level-shift transistor 44 is of the P-channel enhancement-mode type; the second level-shift transistor 46 is of the N-channel depletion-mode type (also known as "native N-channel transistor"). Furthermore, the first and the second level-shift transistors 44, 46 are, for example, of the type with source terminal connected to the bulk.

In detail, the first level-shift generator 40 has a first and a second conduction terminal, which are connected to the supply node $N_{DD}$ and to the source terminal, respectively, of the first level-shift transistor 44, which forms a first internal node $N_1$, which electrically coincides with the second terminal of the feedback resistor 22. Furthermore, the first level-shift generator 40 has a control terminal, which is connected to a first output of the control circuit 34.

The second level-shift generator 42 has a first and a second conduction terminal, which are connected to the source terminal of the second level-shift transistor 46 and to the ground, respectively, of the readout circuit 30. The source terminal of the second level-shift transistor 46 forms a second internal node $N_2$, which electrically coincides with the second terminal of the feedback resistor 22, and therefore also with the first internal node $N_1$. In addition, the second level-shift generator 42 has a respective control terminal, which is connected to a second output of the control circuit 34.

The drain terminals of the first and of the second level-shift transistors 44, 46 are connected to the ground of the readout circuit 30 and to the supply node $N_{DD}$, respectively. The gate terminals of the first and of the second level-shift transistors 44, 46 are connected together so as to form a third internal node $N_3$, which electrically coincides with the output node OUT.

In greater detail, the control circuit 34 supplies on its own first and second outputs, respectively, a first and a second control signal $V_C$, $V_C'$, which, as described in greater detail hereinafter, depend upon the difference between the output biasing voltage $V_{CMO}$ and the reference voltage $V_{ref}$ so as to form a closed control loop. In this regard, the possible contribution due to the presence of a (small signal) output voltage $V_{out}$ is irrelevant, since said contribution would fall outside the frequency band in which the control circuit 34 operates.

Figure 6:
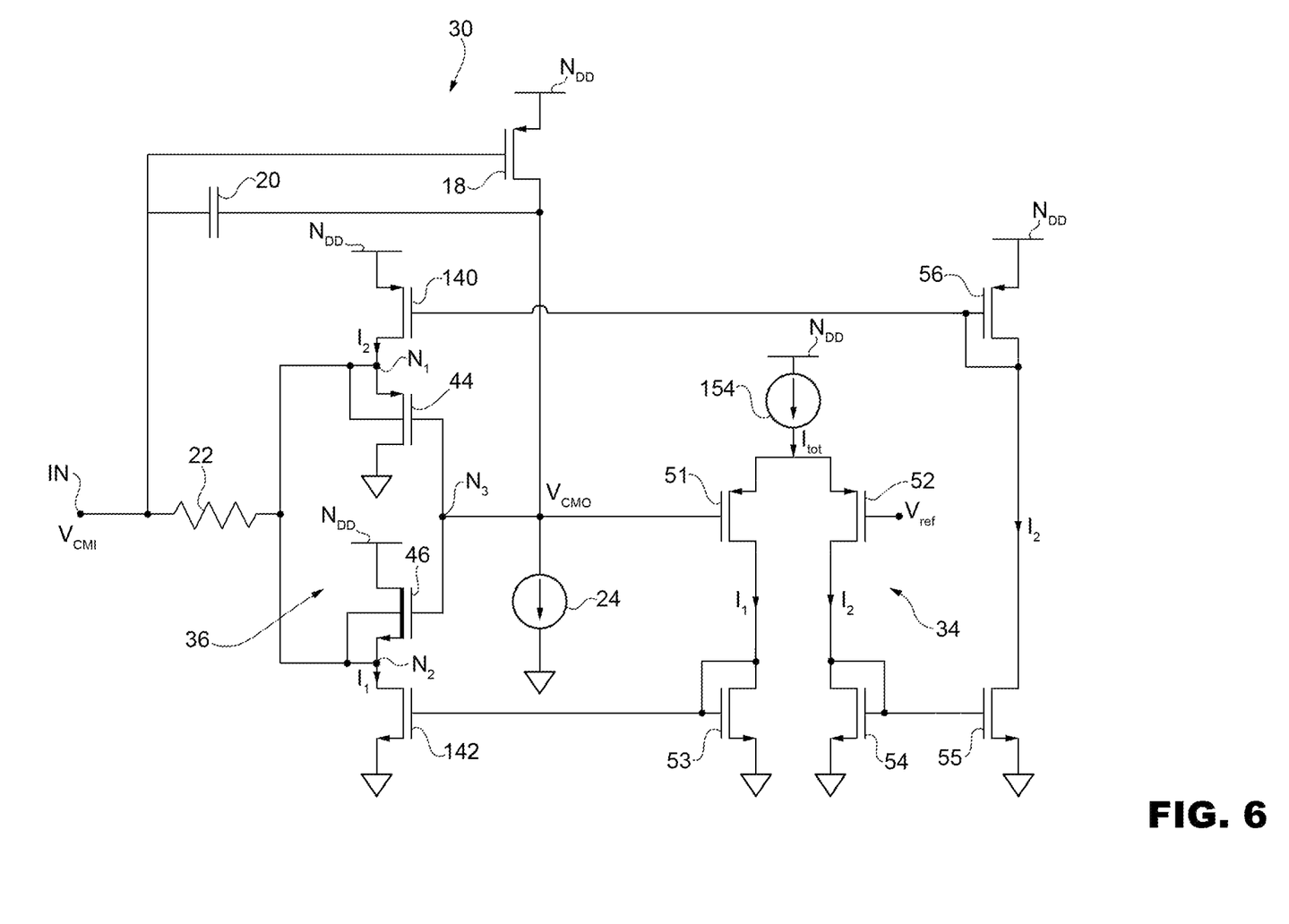
FIGS. 6 and 8 show circuit diagrams of embodiments of the present electronic circuit.

As illustrated in FIG. 6, the readout circuit 30 also comprises a pair of transistors 140, 142, referred to hereinafter respectively as "injection transistor 140" and "pick-up transistor 142".

In particular, the injection transistor 140 is a P-channel enhancement-mode MOSFET, which performs the function of the first level-shift generator 40. For this purpose, the source and drain terminals of the injection transistor 140 are connected to the supply node $N_{DD}$ and to the first internal node $N_1$, respectively.

The pick-up transistor 142 is an N-channel depletion-mode MOSFET, which performs the function of the second level-shift generator 42. For this purpose, the source and drain terminals of the injection transistor 140 are connected to the second internal node $N_2$ and to the supply node $N_{DD}$, respectively.

As illustrated again in FIG. 6, the control circuit 34 is formed by an operational amplifier, and hence comprises a differential pair formed by a first and a second MOSFET 51, 52, referred to hereinafter as the "first control transistor 51" and the "second control transistor 52", respectively. In particular, the first and the second control transistors 51, 52 are P-channel enhancement-mode MOSFETs, the source terminals of which are connected together.

The control circuit 34 further comprises a respective current generator 154, referred to hereinafter as "control generator 154". In particular, the control generator 154 is interposed between the supply node $N_{DD}$ and the source terminals of the first and the second control transistors 51, 52. Furthermore, the control generator 154 generates a constant current $I_{tot}$, which divides between the first and the second control transistors 51, 52 as a function of the voltages present on the respective gate terminals, as described hereinafter. For this purpose, the gate terminal of the first control transistor 51 is connected to the third internal node $N_3$, and therefore also to the output node OUT (not shown in FIG. 6), and the gate terminal of the second control transistor 52 is set at the reference voltage $V_{ref}$.

The control circuit 34 further comprises a third, a fourth, a fifth and a sixth control transistor 53, 54, 55, 56.

In detail, the third, the fourth and the fifth control transistors 53, 54, 55 are N-channel enhancement-mode MOSFETs; the sixth control transistor 56 is a P-channel enhancement-mode MOSFET. Furthermore, the third, the fourth and the sixth control transistors 53, 54, 56 are diode-connected; i.e., they have the respective drain terminals connected to the respective gate terminals.

In greater detail, the drain terminals of the third and fourth control transistors 53, 54 are connected to the drain terminals of the first and the second control transistors 51, 52, respectively, and the source terminals of the third and the fourth control transistors 53, 54 are connected to the ground of the readout circuit 30. The gate terminals of the third and the fourth control transistors 53, 54 are connected to the gate terminal of the pick-up transistor 142 and to the gate terminal of the fifth control transistor 55, respectively. The source and drain terminals of the fifth control transistor 55 are connected to the ground of the readout circuit 30 and to the drain terminal of the sixth control transistor 56, respectively. The gate and source terminals of the sixth control transistor 56 are connected to the gate terminal of the injection transistor 140 and to the supply node $N_{DD}$, respectively.

In practice, the third control transistor 53 and the pick-up transistor 142 form a first current mirror, which purely by way of example has a unitary mirroring ratio.

Consequently, if $I_1$ is the current that flows in the first control transistor 51, then also the current that flows in the pick-up transistor 142 is equal to the current $I_1$. In other words, the current drawn by the pick-up transistor 142 from the second internal node $N_2$, and therefore from the second level-shift transistor 46, is equal to the current $I_1$.

The fourth and fifth control transistors 54, 55 form a second current mirror, which purely by way of example has a unitary mirroring ratio. Consequently, if $I_2$ is the current that flows in the second control transistor 52, then also the current that flows in the fifth control transistor 55 is equal to the current $I_2$. In addition, the sum of the currents $I_1$ and $I_2$ is equal to the current $I_{tot}$.

The sixth control transistor 56 and the injection transistor 140 form a third current mirror, which purely by way of example has a unitary mirroring ratio. Therefore, the current that flows in the injection transistor 140 is equal to the current $I_2$. In other words, the current injected into the first internal node $N_1$, and therefore into the first level-shift transistor 44, by the injection transistor 140 is equal to the current $I_2$.

In practice, the voltages on the gate terminals of the injection transistor 140 and of the pick-up transistor 142 represent the aforementioned first and second control signals $V_C$, $V_C'$.

In use, the first and the second level-shift transistors 44, 46 operate as voltage followers, since the voltage variations on the respective source terminals follow the voltage variations on the respective gate terminals (and vice versa). Furthermore, in the feedback resistor 22 current does not flow (either in the presence or in the absence of acoustic signals), and the first and the second internal nodes $N_1$, $N_2$ are at a voltage equal to $V_{DD}-|V_{GS}|$, where, as mentioned previously, $V_{GS}$ is the gate-to-source voltage of the MOSFET 18.

The control circuit 34 functions as a transconductance operational amplifier, which detects the difference between the output biasing voltage $V_{CMO}$, present on the third internal node $N_3$, and the reference voltage $V_{ref}$, consequently controlling the injection transistor 140 and the pick-up transistor 142 so as to vary the current that is injected into the first level-shift transistor 44 and the current that is drawn from the second level-shift transistor 46.

The variations of the current injected into the first level-shift transistor 44 and of the current drawn from the second level-shift transistor 46 cause consequent variations of the voltages of the source terminals of the first and the second level-shift transistors 44, 46. In particular, as the current injected into the first level-shift transistor 44 increases, the voltage on the gate terminal of the latter, and therefore on the first internal node $N_1$, decreases. Furthermore, as the current tapped from the second level-shift transistor 46 increases, the voltage on the gate terminal of the latter, and therefore on the second internal node $N_2$, increases. Since, in each of the first and the second level-shift transistors 44, 46, the voltage on the respective gate terminal is equal to the voltage on the respective source terminal (except for the contribution due to the corresponding gate-to-source voltage), the output biasing voltage $V_{CMO}$, present on the third internal node $N_3$, is found to be a combination of the input biasing voltage $V_{CMI}$, present on the input node IN, and any one of the gate-to-source voltages of the first and the second level-shift transistors 44, 46.

Figure 7:
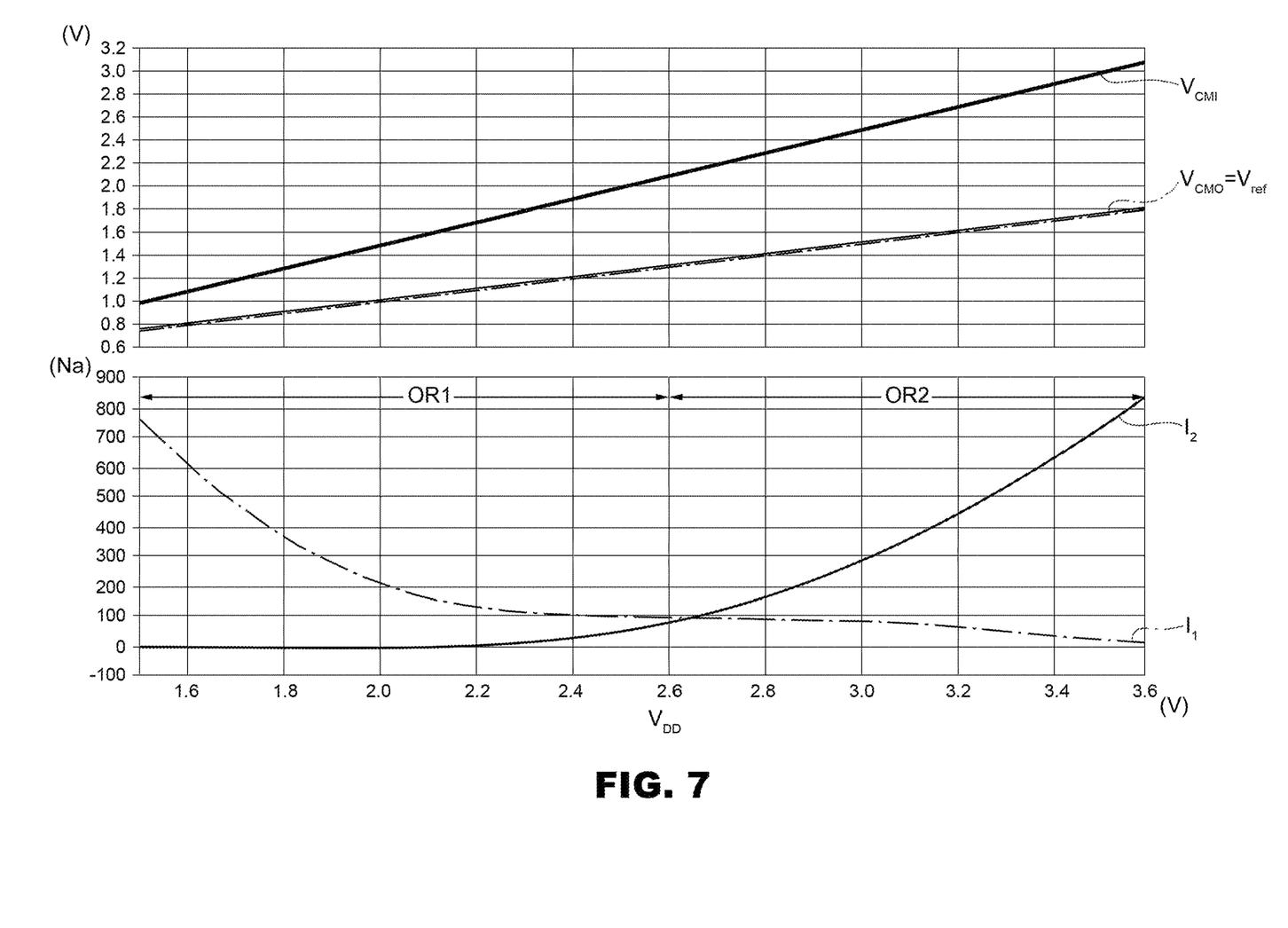
FIG. 7 shows plots of voltages and currents generated within the present electronic circuit, as a function of a supply voltage $V_{DD}$.

FIG. 7 shows an example of the plots of the input biasing voltage $V_{CMI}$ and of the output biasing voltage $V_{CMO}$, as a function of the supply voltage $V_{DD}$, as well as the plots of the currents $I_1$ and $I_2$, i.e., of the currents that flow in the second level-shift transistor 46 and in the first level-shift transistor 44, respectively. It may be noted that, for relatively low values of the supply voltage $V_{DD}$, the current $I_2$ is to a first approximation negligible, and hence the first level-shift transistor 44 is inhibited, unlike the second level-shift transistor 46, which operates in saturation; instead, for relatively high values of the supply voltage $V_{DD}$, the current $I_1$ becomes to a first approximation negligible, and therefore the second level-shift transistor 46 is inhibited, whereas the first level-shift transistor 44 operates in saturation.

In practice, thanks to an extremely low threshold voltage, the second level-shift transistor 46 follows, for low values of the supply voltage $V_{DD}$, the reference voltage $V_{ref}$, varying the voltage on its gate terminal accordingly. In other words, the output biasing voltage $V_{CMO}$ is imposed by the second level-shift transistor 46, which prevails over the first level-shift transistor 44. In particular, the first level-shift transistor 44 is inhibited as, due to its threshold voltage (for example, with a modulus equal to 650 mV), there is no sufficient voltage difference between its source and gate terminals.

Next, as the supply voltage $V_{DD}$ increases, the first level-shift transistor 46 switches on and tends to prevail over the first level-shift transistor 44, feeding back onto its own gate terminal the voltage present on its own source terminal minus the absolute value of its own gate-to-source voltage. In this way, the difficulty of significantly raising, by the second level-shift transistor 46, the voltage on its own gate terminal, is obviated even when the transistor 46 is crossed by a high current. In FIG. 7, the voltage regions in which, the first and the second level-shift transistors 44, 46 prevail are designated by OR2 and OR1, respectively.

FIG. 7 also shows how the output biasing voltage $V_{CMO}$ and the reference voltage $V_{ref}$ are substantially equal, since it is assumed that the gain of the loop that controls the output biasing voltage $V_{CMO}$ as a function of the difference of the latter with respect to the reference voltage $V_{ref}$ is high.

From what has been described and illustrated previously, the advantages that the present solution affords are evident.

In particular, in the readout circuit 30, the output biasing voltage $V_{CMO}$ does not follow, but for an approximately constant offset, the supply voltage $V_{DD}$. Instead, the output biasing voltage $V_{CMO}$ is directly proportional to the supply voltage $V_{DD}$, which guarantees an increase of the output dynamic range, in addition to a decoupling from the input biasing voltage $V_{CMI}$.

In other words, as the supply voltage $V_{DD}$ increases, we find a corresponding increase in the AOP.

In addition, the output biasing voltage $V_{CMO}$ is set through a closed control loop, hence in a particularly accurate way.

Moreover, the readout circuit 30 maintains a high input impedance and, for small signals, maintains the same transfer function (understood as ratio between the output voltage $V_{out}$ and the charge generated by the transducer). In this regard, it can be demonstrated that, in a small-signal regime, $V_{out}=31\ q/C_f$, where q designates the charge generated by the MEMS transducer 8 and $C_f$ designates the capacitance of the feedback capacitor 20.

Figure 8:
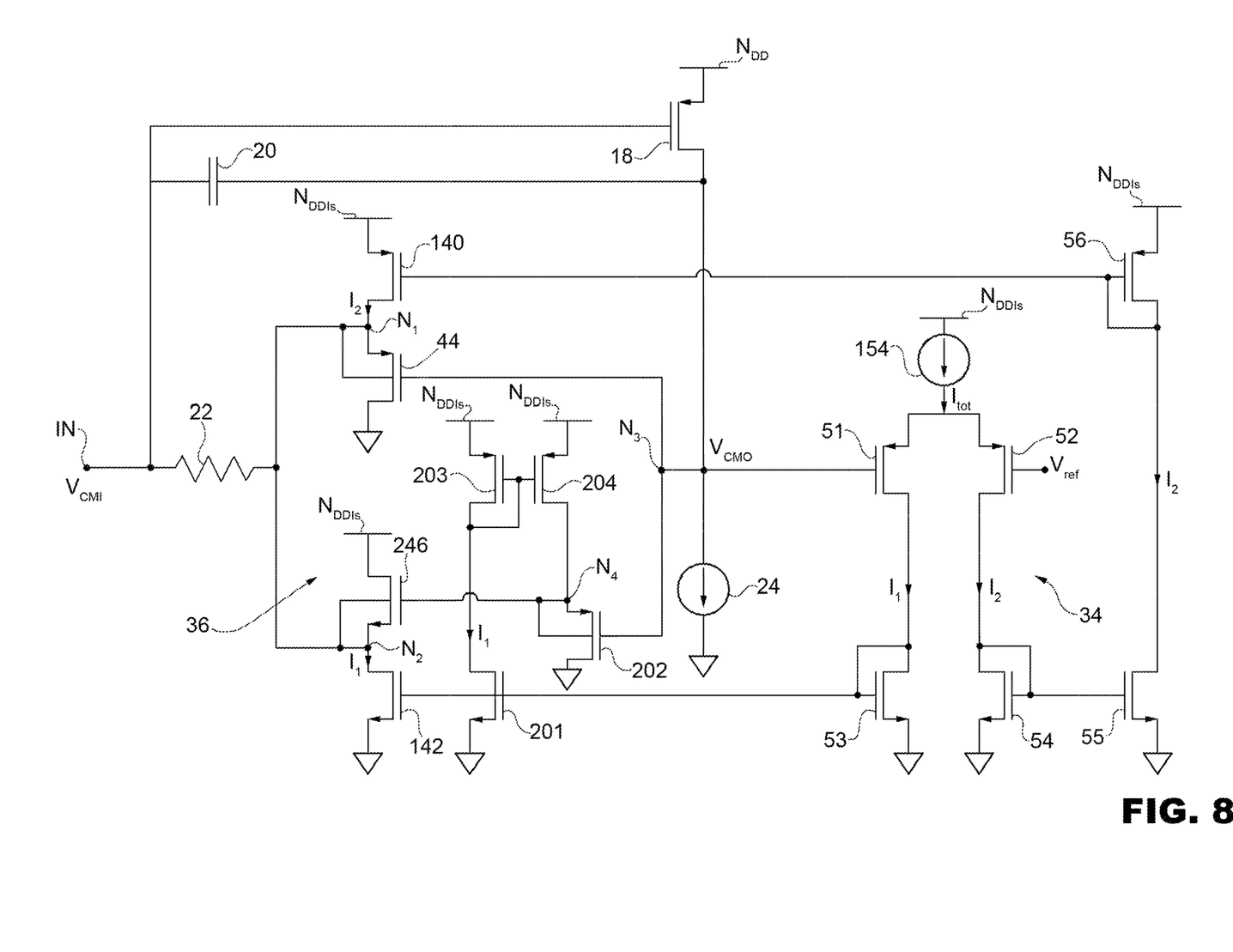

FIG. 8 shows a possible alternative, which is now described limitedly to the differences with respect to what is illustrated in FIG. 6. This alternative does not envisage the use of depletion transistors, and is hence suited to being manufactured in the simplest way in comparison to what is illustrated in FIG. 6, for example by using standard CMOS manufacturing technologies.

In detail, the second level-shift transistor, here designated by 246, is of the N-channel enhancement-mode type, and hence has a threshold voltage higher than in the case illustrated in FIG. 6. The gate terminal of the second level-shift transistor 246 is connected to a fourth internal node $N_4$, instead of to the third internal node $N_3$. In addition, the source terminals of the injection transistor 140 and of the sixth control transistor 56 and the drain terminal of the second level-shift transistor 246 are connected to an additional supply node $N_{DDls}$, which is set at an additional supply voltage $V_{DDls}$, which is such that $V_{DDls} \geq V_{DD}+\Delta V$, with $\Delta V$ at least equal, for example, to 100 mV. The control generator 154 is interposed between the additional supply node $N_{DDls}$ and the source terminals of the first and the second control transistors 51, 52.

Moreover, the readout circuit 30 comprises a first, a second, a third and a fourth additional transistor 201, 202, 203, 204.

The first additional transistor 201 is a N-channel enhancement-mode MOSFET, the source terminal of which is connected to the ground of the readout circuit 30, and the gate terminal of which is connected to the gate terminal of the third control transistor 53 so as to form a fourth current mirror, which purely by way of example has a unitary mirroring ratio.

The second, the third and the fourth additional transistors 202, 203, 204 are P-channel enhancement-mode MOSFETs. Furthermore, the second additional transistor 202 is of the type with source terminal connected to the bulk.

In particular, the gate terminals of the third and of the fourth additional transistors 203, 204 are connected together. Furthermore, the source terminals of the third and of the fourth additional transistors 203, 204 are connected to the additional supply node $N_{DDls}$. The drain terminal of the third additional transistor 203 is connected to the drain terminal of the first additional transistor 201, as well as to the gate terminal of the third additional transistor 203, which is hence diode-connected.

The drain terminal of the fourth additional transistor 204 and the source terminal of the second additional transistor 202 are connected to the fourth internal node $N_4$. The gate terminal and the drain terminal of the second additional transistor 202 are connected to the third internal node $N_3$ and to the ground of the readout circuit 30, respectively.

Thanks to the fourth current mirror, flowing in the first additional transistor 201 is the current $I_1$, which flows also in the second and fourth additional transistors 202, 204, since the third and fourth additional transistors 203, 204 form a fifth current mirror, which purely by way of example has a unitary mirroring ratio.

Operatively, the voltage on the fourth internal node $N_4$ is equal to the voltage present on the second internal node $N_2$, plus the gate-to-source voltage of the second level-shift transistor 246. Furthermore, the voltage on the third internal node $N_3$ is equal to the voltage present on the fourth internal node $N_4$ minus the absolute value of the gate-to-source voltage of the second additional transistor 202, which to a first approximation is equal to the absolute value of the gate-to-source voltage of the second level-shift transistor 246. In this way, the plots of the voltage on the third internal node $N_3$ and of the currents $I_1$ and $I_2$ remain substantially the same as what has been described with reference to the embodiment illustrated in FIG. 6.

The fact that the additional supply voltage $V_{DDls}$ is higher than the supply voltage $V_{DD}$ makes it possible to guarantee a correct drain-to-source voltage of the fourth additional transistor 204, which, as also the other transistors, operates in saturation.

In conclusion, it is clear that further modifications and variations may be made to what has been described and illustrated herein, without thereby departing from the scope of the present disclosure, as defined in the annexed claims.

For instance, the mirroring ratios of one or more of the current mirrors may not be unitary ratios.

Instead of the MOSFET 18 a circuit including an operational amplifier (not illustrated) may be present.

Finally, all the MOSFETs may have channels reversed with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
an input;
an output;
an amplification stage coupled between the input and the output and configured to bias the input at a first direct current (DC) voltage; and
a feedback circuit including a level shifter and coupled between the input and the output, the feedback circuit being configured to bias the output at a second DC voltage, wherein the level shifter is configured to bias the output at the second DC voltage based on a difference between the second DC voltage and a reference voltage.

2. The circuit according to claim 1, wherein the input is configured to be coupled to a transducer.

3. The circuit according to claim 1, comprising:
a feedback capacitance having a first side coupled to the input and a second side coupled to the output; and
a feedback resistance having a first terminal coupled to the input and a second terminal.

4. The circuit according to claim 3, wherein the level shifter includes:
first and second transistors each having a respective first conduction terminal coupled to the second terminal of the feedback resistance, a respective control terminal coupled to the output, and a respective second conduction terminal.

5. The circuit according to claim 4, wherein the feedback circuit includes:
   a transconductance amplifier configured to cause a first current to be drawn from the second transistor and cause a second current to be source into the first transistor based on a difference between the second DC voltage and the reference voltage.

6. The circuit according to claim 5, wherein the transconductance amplifier includes:
   a first differential transistor pair having a control terminal coupled to the output;
   a second differential transistor pair having a control terminal configured to receive the reference voltage;
   a first current mirror, coupled to the first differential transistor pair and configured to set the first current to a current flowing in the first differential transistor pair; and
   a second current mirror, coupled to the second differential transistor pair and configured to set the second current to a current flowing in the second differential transistor pair.

7. The circuit according to claim 1, wherein the amplification stage includes:
   an amplification transistor having a control terminal coupled to the input, a first conduction terminal coupled to the output, and a second conduction terminal configured to receive a supply voltage.

8. A device, comprising:
   a microelectromechanical system (MEMS) transducer having an output and configured to generate, at the output, an electrical charge that varies temporally; and
   a charge amplifier circuit including:
      an input coupled to the output of the MEMS transducer;
      an output;
      an amplification stage coupled between the input and the output and configured to bias the input at a first direct current (DC) voltage, wherein the amplification stage includes an amplification transistor having a control terminal coupled to the input, a first conduction terminal coupled to the output, and a second conduction terminal configured to receive a supply voltage; and
      a feedback circuit including a level shifter and coupled between the input and the output, the feedback circuit being configured to bias the output at a second DC voltage.

9. The device according to claim 8, wherein the charge amplifier circuit includes:
   a feedback capacitance having a first side coupled to the input and a second side coupled to the output; and
   a feedback resistance having a first terminal coupled to the input and a second terminal.

10. The device according to claim 9, wherein the level shifter includes:
   first and second transistors each having a respective first conduction terminal coupled to the second terminal of the feedback resistance, a respective control terminal coupled to the output, and a respective second conduction terminal.

11. The device according to claim 10, wherein the feedback circuit includes:
   a transconductance amplifier configured to cause a first current to be drawn from the second transistor and cause a second current to be source into the first transistor based on a difference between the second DC voltage and a reference voltage.

12. The device according to claim 11, wherein the transconductance amplifier includes:
   a first differential transistor pair having a control terminal coupled to the output;
   a second differential transistor pair having a control terminal configured to receive the reference voltage;
   a first current mirror, coupled to the first differential transistor pair and configured to set the first current to a current flowing in the first differential transistor pair; and
   a second current mirror, coupled to the second differential transistor pair and configured to set the second current to a current flowing in the second differential transistor pair.

13. The device according to claim 8, wherein the level shifter is configured to bias the output at the second DC voltage based on a difference between the second DC voltage and a reference voltage.

14. A method, comprising:
   receiving, at an input of a charge amplifier circuit, an electrical charge that varies temporally;
   biasing the input at a first direct current (DC) voltage; and
   biasing an output of the charge amplifier circuit at a second DC voltage, wherein a level shifter biases the output at the second DC voltage based on a difference between the second DC voltage and a reference voltage.

15. The method according to claim 14, wherein the charge amplifier circuit includes:
   a feedback capacitance coupled between the input and the output,
   a feedback resistance having a first terminal coupled to the input and a second terminal; and
   the level shifter coupled between the second terminal of the feedback resistance and the output.

16. The method according to claim 15, comprising:
   drawing, by a transconductance amplifier, a first current from a first transistor and injecting a second current into a second transistor based on a difference between the second DC voltage and the reference voltage, wherein the first and second transistors each have a respective first conduction terminal coupled to the second terminal of the feedback resistance, a respective control terminal coupled to the output, and a respective second conduction terminal.

17. The method according to claim 16, comprising:
   causing, by the transconductance amplifier, a current that is the same as the first current to flow in a third transistor, wherein the third transistor has a first conduction terminal coupled to the control terminal of the second transistor, a control terminal coupled to the output, and a second conduction terminal.

18. The method according to claim 16, comprising:
   setting, by a mirror circuitry, the first and second currents to currents that flow in first and second differential transistor pairs of a differential pair, respectively, wherein the first differential transistor pair has a control terminal coupled to the output and the second differential transistor pair has a control terminal configured to receive the reference voltage.

* * * * *